United States Patent
Chung et al.

(10) Patent No.: US 12,517,231 B2
(45) Date of Patent: Jan. 6, 2026

(54) OUTPUT STAGE CIRCUIT, DAC, TOF SYSTEM AND CURRENT DRIVING METHOD

(71) Applicant: PixArt Imaging Inc., Hsin-Chu (TW)

(72) Inventors: Yueh-Lin Chung, Hsin-Chu (TW); Tso-Sheng Tsai, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 801 days.

(21) Appl. No.: 17/898,432

(22) Filed: Aug. 29, 2022

(65) Prior Publication Data
US 2024/0069173 A1    Feb. 29, 2024

(51) Int. Cl.
*H03M 1/82* (2006.01)
*G01B 11/22* (2006.01)
*G01S 7/4865* (2020.01)
*H03M 1/80* (2006.01)

(52) U.S. Cl.
CPC ............ *G01S 7/4865* (2013.01); *G01B 11/22* (2013.01); *H03M 1/802* (2013.01); *H03M 1/82* (2013.01)

(58) Field of Classification Search
CPC ............ H03M 1/08; H03M 1/66; H03M 1/82; H03M 1/802
See application file for complete search history.

(56) References Cited

U.S. PATENT DOCUMENTS

| | | | | |
|---|---|---|---|---|
| 5,537,070 A | * | 7/1996 | Risinger | H03K 17/163 327/170 |
| 5,572,154 A | * | 11/1996 | Rakers | H03K 17/74 327/494 |
| 6,437,720 B1 | * | 8/2002 | Yin | H03M 1/0663 341/172 |
| 6,859,159 B2 | * | 2/2005 | Michalski | H03M 1/08 341/172 |
| D896,763 S | * | 9/2020 | Chen | D13/133 |
| 12,117,339 B1 | * | 10/2024 | Tsai | G01J 1/44 |
| 2002/0036577 A1 | * | 3/2002 | Volk | H03M 1/0624 341/136 |
| 2002/0113724 A1 | * | 8/2002 | Yin | H03M 1/0663 341/150 |
| 2004/0070917 A1 | * | 4/2004 | Michalski | H03M 1/08 361/256 |
| 2011/0018750 A1 | * | 1/2011 | Payne | G05F 3/265 327/155 |
| 2011/0178767 A1 | * | 7/2011 | Bartling | G01R 31/31725 702/176 |

(Continued)

*Primary Examiner* — Lam T Mai
(74) *Attorney, Agent, or Firm* — Winston Hsu

(57) ABSTRACT

An output stage circuit, comprising: a current source circuit; an output switch circuit, comprising at least one output switch, coupled to the current source circuit, wherein an output current flows through a target circuit when the output switch circuit is conducted; at least one bias capacitor, coupled to the current source circuit; and a bias switch circuit, configured to receive a bias voltage, comprising at least one bias switch, coupled to the bias capacitor and the current source circuit, wherein the bias voltage charges the bias capacitor when the bias switch circuit is conducted. The present invention further discloses a DAC applying the output stage circuit and a TOF system applying the DAC. The conventional kick back issue can be improved by the mechanism provided by the present invention.

21 Claims, 9 Drawing Sheets

(56) References Cited

U.S. PATENT DOCUMENTS

| | | | |
|---|---|---|---|
| 2016/0142014 A1* | 5/2016 | Okazaki | H03F 1/0261 |
| | | | 330/296 |
| 2018/0048234 A1* | 2/2018 | Pan | G11C 5/147 |
| 2019/0277800 A1* | 9/2019 | Chung | G01N 27/4145 |
| 2022/0066035 A1* | 3/2022 | Chung | G01S 7/4911 |
| 2023/0024327 A1* | 1/2023 | Zhou | H03M 1/745 |
| 2023/0308110 A1* | 9/2023 | Huang | H03M 1/167 |
| 2024/0069173 A1* | 2/2024 | Chung | H03M 1/742 |

* cited by examiner

OUTPUT STAGE CIRCUIT, DAC, TOF SYSTEM AND CURRENT DRIVING METHOD

BACKGROUND OF THE INVENTION

1. Field of the Invention

The present invention relates to an output stage circuit, a DAC (Digital to Analog Converter), a TOF (Time Of Flight) system and a current driving method, and particularly relates to an output stage circuit, a DAC, a TOF system and a current driving method which can improve the kick back issue.

2. Description of the Prior Art

An output stage circuit is applied to provide a desired current for a target circuit. However, some conventional output stage circuits may have high power consumptions since some components still have standby currents flowing there through when the desired current is not provided for the target circuit. Alternatively, some conventional output stage circuits may have low power consumptions but do not have a good current limitation mechanism.

Also, for some conventional output stage circuits, the current flowing through the target circuit may be interfered when the output stage circuit is coupled to a power voltage or dis-coupled from the power voltage. Such issue is called a kick back issue.

Therefore, a new output stage circuit is needed to solve this problem.

SUMMARY OF THE INVENTION

One objective of the present invention is to provide an output stage circuit which can improve the kick back issue.

Another objective of the present invention is to provide a DAC which can improve the kick back issue.

Still another objective of the present invention is to provide a TOF system which can improve the kick back issue.

Still another objective of the present invention is to provide a current driving method which can improve the kick back issue.

One embodiment of the present invention discloses an output stage circuit, comprising: a current source circuit; an output switch circuit, comprising at least one output switch, coupled to the current source circuit, wherein an output current flows through a target circuit when the output switch circuit is conducted; at least one bias capacitor, coupled to the current source circuit; and a bias switch circuit, configured to receive a bias voltage, comprising at least one bias switch, coupled to the bias capacitor and the current source circuit, wherein the bias voltage charges the bias capacitor when the bias switch circuit is conducted.

Another embodiment of the present invention discloses a digital to analog converter, comprising: a current source circuit; an output switch circuit, comprising at least one output switch, coupled to the current source circuit, wherein an output current flows through a target circuit when the output switch circuit is conducted; at least one bias capacitor, coupled to the current source circuit; and a bias switch circuit, configured to receive a bias voltage, comprising at least one bias switch, coupled to the bias capacitor and the current source circuit, wherein the bias voltage charges the bias capacitor when the bias switch circuit is conducted.

Still another embodiment of the present invention discloses a time of flight system, comprising: a light source circuit, controlled by a light emitting signal to emit light; a current source circuit; an output switch circuit, comprising at least one output switch, coupled to the current source circuit and controlled by the light emitting signal to be conducted or non-conducted, wherein an output current flows through the light source circuit when the output switch circuit is conducted; at least one bias capacitor, coupled to the current source circuit; and a bias switch circuit, configured to receive a bias voltage, comprising at least one bias switch, coupled to the bias capacitor and the current source circuit, wherein the bias voltage charges the bias capacitor when the bias switch circuit is conducted.

Still another embodiment of the present invention discloses a current driving method, applied to an output stage circuit comprising a current source circuit, comprising: holding a bias voltage for the current source circuit in a calibration time interval; and controlling the current source circuit not to provide an output current for the target circuit and then provide the output current for the target circuit in the calibration time interval.

In view of above-mentioned embodiment, the interference of the current flowing through the target circuit which occurs when the output stage circuit is coupled to a power voltage or dis-coupled from the power voltage can be compensated. Therefore, the conventional kick back issue can be improved. Besides, the output stage circuit only needs a low standby current and can control a current size of the output current by setting parameters of transistors in the current source.

These and other objectives of the present invention will no doubt become obvious to those of ordinary skill in the art after reading the following detailed description of the preferred embodiment that is illustrated in the various figures and drawings.

DETAILED DESCRIPTION

Several embodiments are provided in following descriptions to explain the concept of the present invention. The method in following descriptions can be executed by programs stored in a non-transitory computer readable recording medium such as a hard disk, an optical disc or a memory. Additionally, the term "first", "second", "third" in following descriptions are only for the purpose of distinguishing different one elements, and do not mean the sequence of the elements. For example, a first device and a second device only mean these devices can have the same structure but are different devices. Further, in following embodiment, the output stage circuit can be applied to provide a current for a light source circuit. However, the light source circuit can be replaced by any other target circuit.

Figure 1:
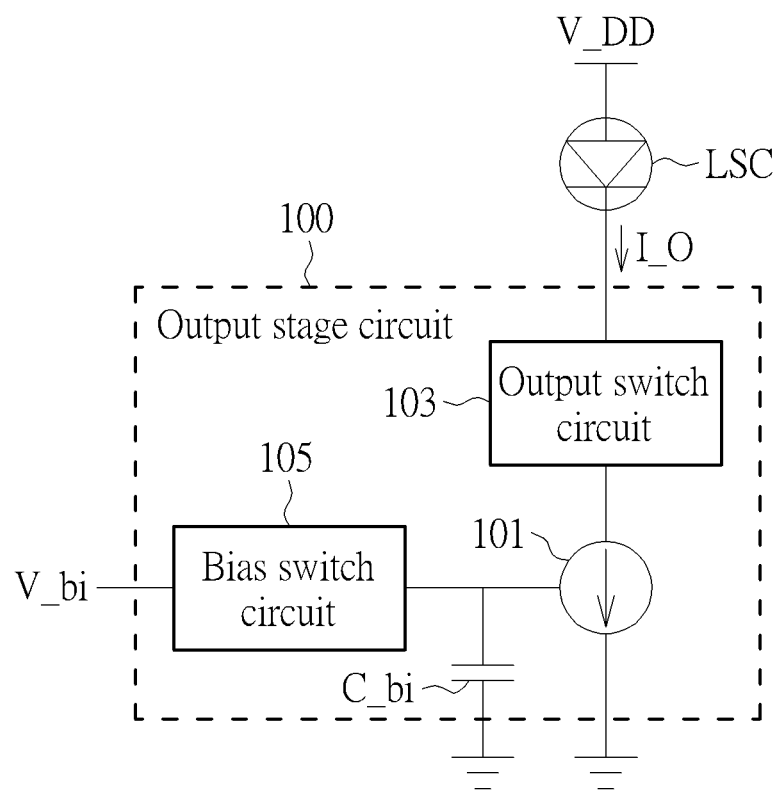
FIG. 1 is a schematic diagram illustrating an output stage circuit according to one embodiment of the present invention.

FIG. 1 is a schematic diagram illustrating an output stage circuit according to one embodiment of the present invention. As illustrated in FIG. 1, the output stage circuit 100 comprises a current source circuit 101, an output switch circuit 103, at least one bias capacitor (in this embodiment, one bias capacitor C_b1) and a bias switch circuit 105. The output switch circuit 103 comprises at least one output switch, and is coupled to the current source circuit 101 and the light source circuit LSC. The light source circuit LSC is coupled to a power voltage V_DD. An output current I_O flows through the light source circuit LSC when the output switch circuit 103 is conducted and the output current I_O does not flow through the light source circuit LSC when the output switch circuit 103 is non-conducted. The bias switch circuit 105 is configured to receive a bias voltage V_bi during an interval, which can be seen as a rectangular pulse. The bias switch circuit 105 comprises at least one bias switch, and is coupled to the bias capacitor C_bi and the current source circuit 101. The bias capacitor C_bi is further coupled to a grounding voltage. The bias voltage V_bi charges the bias capacitor C_bi when the bias switch circuit 105 is conducted and the bias voltage V_bi does not charge the bias capacitor C_bi when the bias switch circuit 105 is non-conducted.

Figure 2:
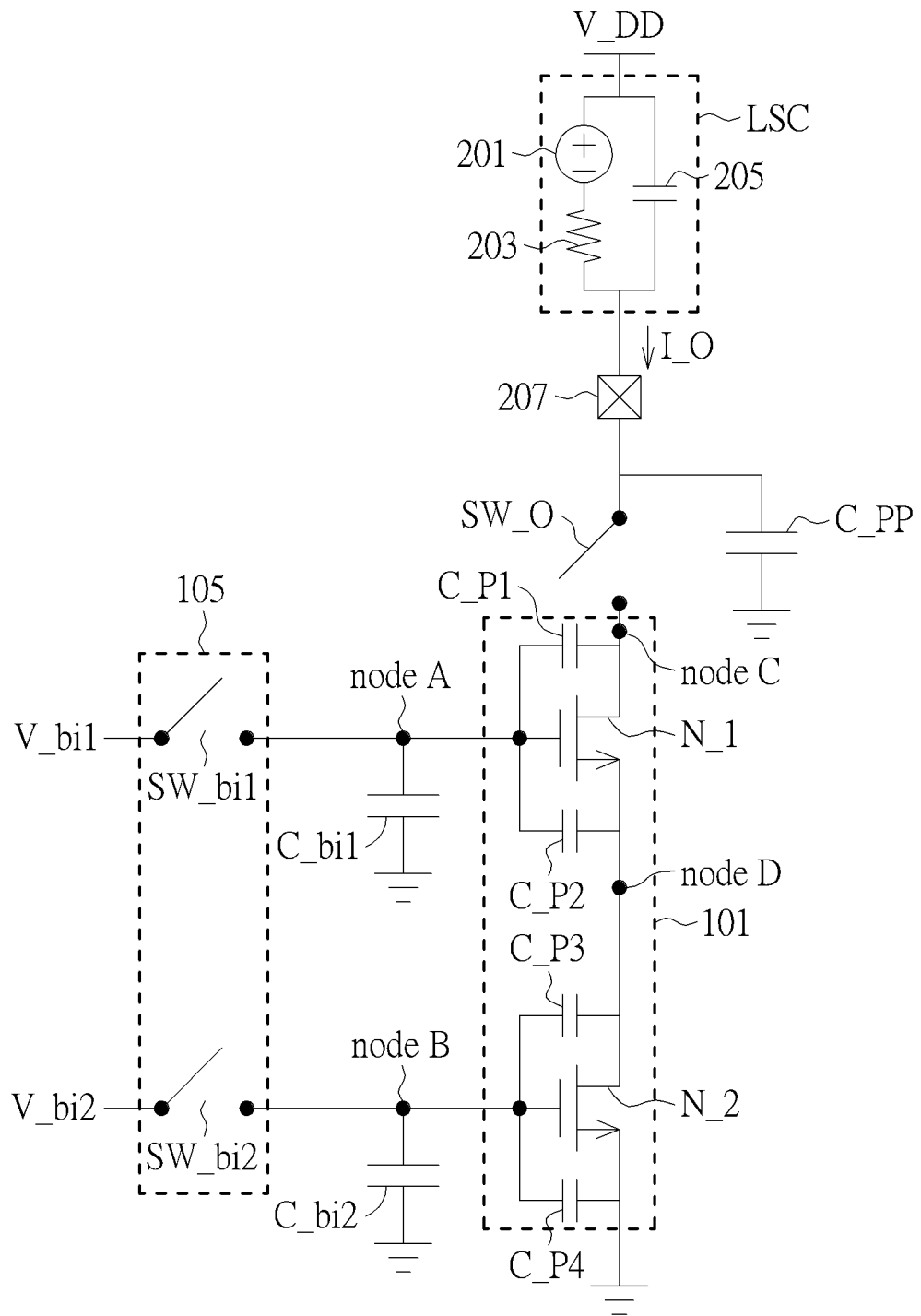
FIG. 2 is a detail circuit diagram of the output stage circuit illustrated in FIG. 1, according to one embodiment of the present invention.

FIG. 2 is a detail circuit diagram of the output stage circuit illustrated in FIG. 1, according to one embodiment of the present invention. In the embodiment of FIG. 2, the light source circuit LSC comprises a light source 201 (e.g., an LED, a laser diode, or a directional light source), and further comprises a resistor 203 and a capacitor 205, are not limited thereto. The light source 201 is coupled to the power voltage V_DD, the resistor 203 is coupled to the light source 201 and an I/O pad 207, and the capacitor 205 is coupled between the power voltage V_DD and the I/O pad 207.

The output switch circuit 103 in FIG. 1 comprises an output switch SW_O coupled to the I/O pad 207 and the current source circuit 101. Also, the I/O pad 207 is provided between the light source circuit LSC and the capacitor C_PP, which means pad parasitic capacitance of the I/O pad 207. The capacitor C_PP is formed between the I/O pad 207 and a grounding voltage. The current source circuit 101 comprises a plurality of transistors coupled in series. In this example, the current source circuit 101 comprises NMOSs N_1 and N_2 coupled in series. Further, in the embodiment of FIG. 2, the output stage circuit 100 comprises two bias capacitors C_bi1, C_bi2 and the bias switch circuit 105 comprises two bias switches SW_bi1, SW_bi2. The bias capacitors C_bi1, C_bi2 and the bias switches SW_bi1, SW_bi2 are respectively coupled to a control terminal of the transistors, that is, coupled to gate terminals of the NMOSs N_1 and N_2.

The bias capacitors C_bi1 is coupled between a node A and the grounding voltage; the bias capacitors C_bi2 is coupled between a node B and the grounding voltage; the NMOSs N_2 is coupled between a node D and the grounding voltage; the NMOSs N_1 is coupled between a node C and the node D. The bias capacitors C_bi1, C_bi2 can be capacitors which are particularly provided, in a particular embodiment, the bias capacitors C_bi1, C_bi2 is formed between two metal layers. In another embodiment, the bias capacitors C_bi1, C_bi2 mean the parasitic capacitances of the NMOSs N_1 and N_2, which are formed between the gate terminals of the NMOSs N_1 and N_2 and the grounding voltage. Also, the capacitors C_P1, C_P2, C_P3 and C_P4 mean parasitic capacitances of the NMOSs N_1 and N_2. For more detail, each of the NMOSs N_1 and N_2 comprises a first terminal (drain terminal), a second terminal (source terminal), and a gate terminal, and each of the NMOSs N_1 and N_2 further comprises: a first parasitic capacitor C_P1 (or C_P3) being formed between the gate terminal and the first terminal, and a second parasitic capacitor C_P2 (or C_P4) being formed between the gate terminal and the second terminal.

Figure 3:
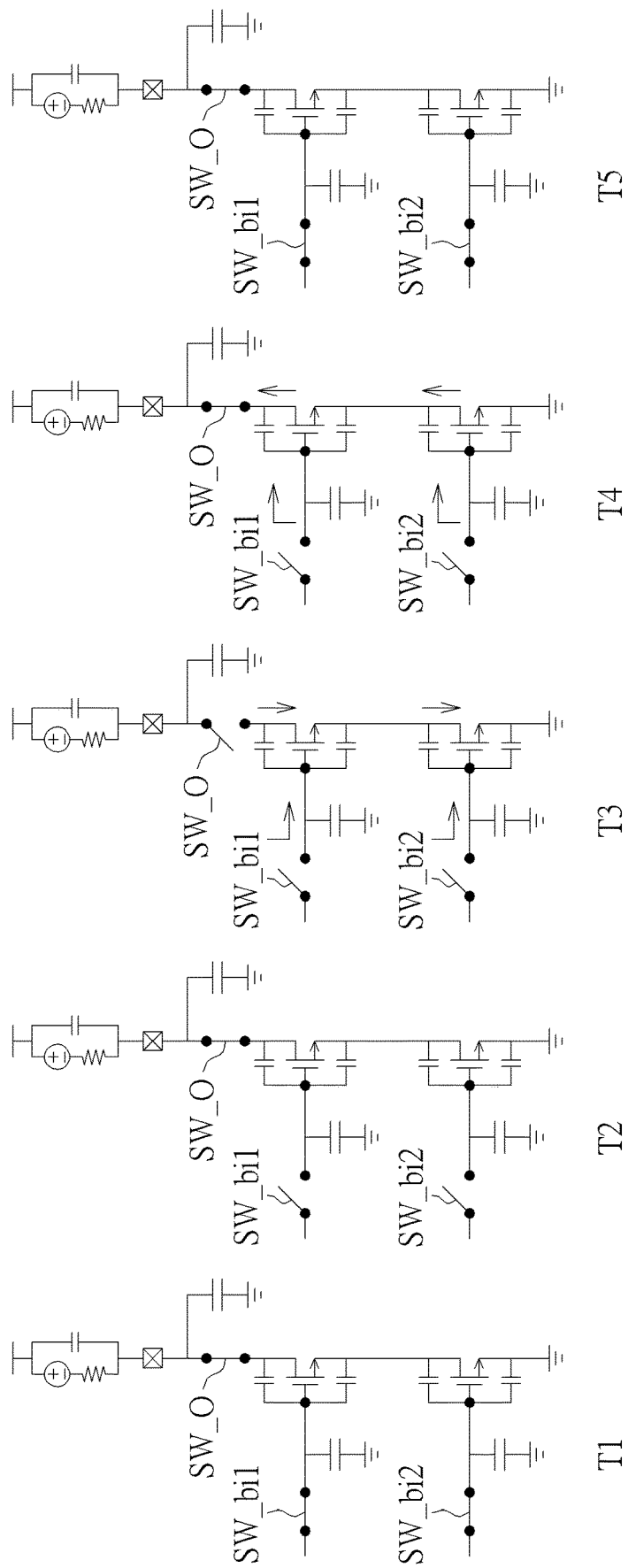
FIG. 3 is a schematic diagram illustrating the operations of the output stage circuit in FIG. 2, according to one embodiment of the present invention.
Figure 4:
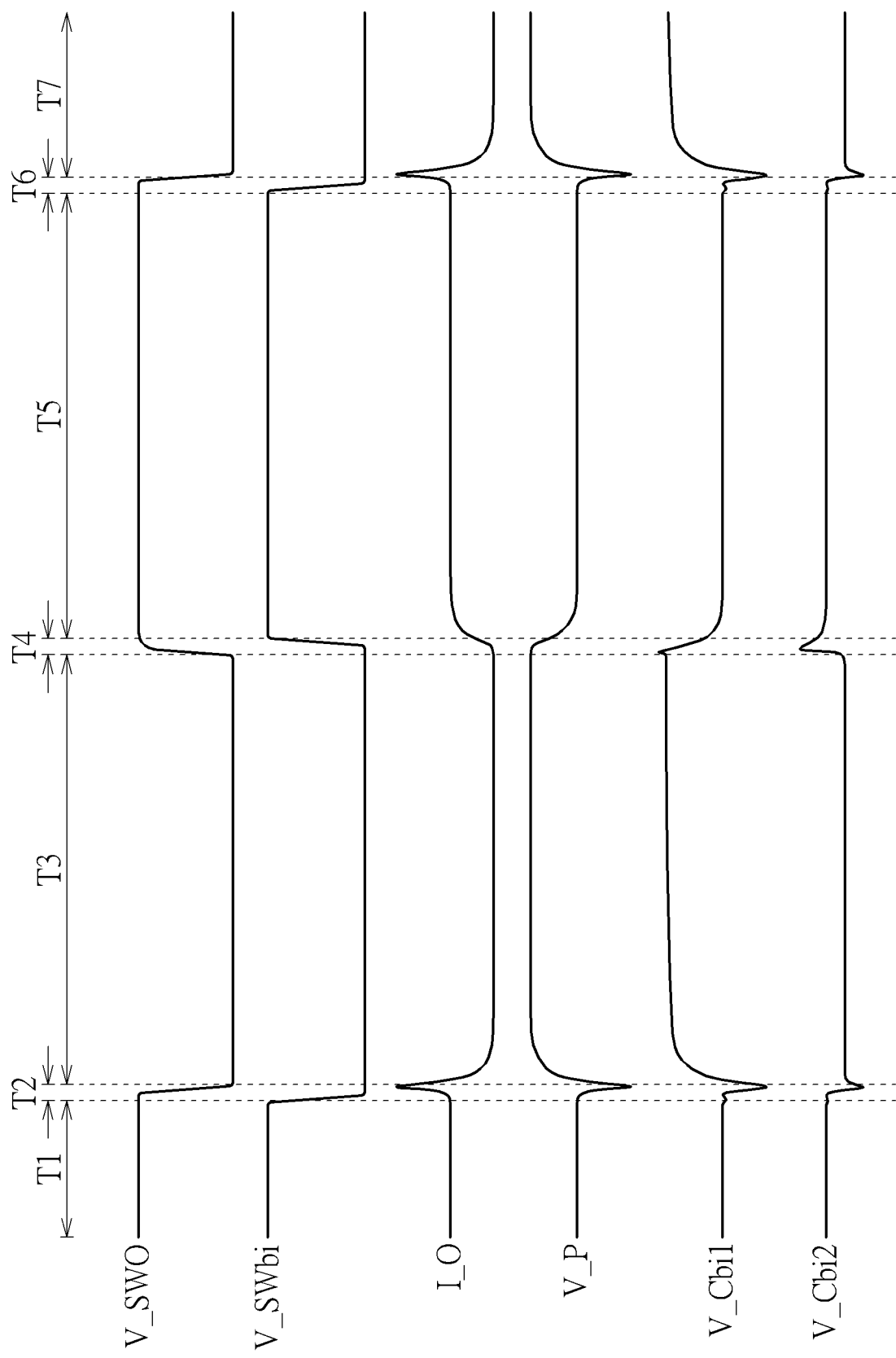
FIG. 4 is a wave chart for signals of the output stage circuit in FIG. 2, according to one embodiment of the present invention.

FIG. 3 is a schematic diagram illustrating the operations of the output stage circuit in FIG. 2, according to one embodiment of the present invention. FIG. 4 is a wave chart for signals of the output stage circuit in FIG. 2, according to one embodiment of the present invention. Please refer to FIG. 3 and FIG. 4 at the same time for a better understanding of the concept of the present invention. Please note, for the convenience of understanding, only the output switch SW_O and the bias switches SW_bi1, SW_bi2 are symbolized in FIG. 3. Also, in FIG. 4, the signal V_SWO means a control voltage for the output switch SW_O, and the signal V_SWbi means a control voltage for the bias switches SW_bi1, SW_bi2. Further, the signal 1_0 means the output current I_O in FIG. 2, and the signal V_P means the voltage of the I/O pad 207. Besides, the signal V_Cbi1 means the voltage of the bias capacitor C_bi1, and the signal V_Cbi2 means the voltage of the bias capacitor C_bi2.

As shown in FIG. 3 and FIG. 4, in the time interval T1, the signals V_SWO and V_SWbi have high logic values, which mean the output switch SW_O and the bias switches SW_bi1, SW_bi2 turn on (conducted). In the time intervals T2, T3, the V_SWbi firstly transits to a low logic value and then the signal V_SWO transits to the low logic value, which mean the bias switches SW_bi1, SW_bi2 firstly turn off and then the output switch SW_O turns off. The output current I_O suddenly raises up in the time interval T2 and goes to 0 in the time interval T3. Oppositely, the signal V_P suddenly drops in the time interval T2 and remains high in the time interval T3. The signal V_Cbi1 slightly drops (kicks back down) in the time interval T2 and is pulled up in the time interval T3 by the voltage stored in the bias capacitor C_bi1. Also, the signal V_Cbi2 slightly drops (kicks back down) in the time interval T2 and is pulled up in the time interval T3 by the voltage stored in the bias capacitor C_bi1. Please note, although the signal V_Cbi1 drops in the time interval T2 in FIG. 4, the drop occurs at the timing that the bias switches SW_bi1 changes from on to off. Therefore, the drop can be regarded as occurring at the end of the time interval T2 and the beginning of the time interval T3. The signal V_Cbi2 also follows the same rule. The operations of kicks back down are shown as the arrows illustrated in the drawing corresponding to the time interval T3.

In the time intervals T4 and T5, the signal V_SWO firstly transits to a high logic value and then the V_SWbi transits to the high logic value, which mean the output switch SW_O firstly turns on and then the bias switches SW_bi1, SW_bi2 turn on. The output current I_O raises up in the time intervals T4 and T5 (i.e., flows through the light source circuit LSC), since the output switch SW_O turns on. Oppositely, the signal V_P decreases in the time intervals T4 and T5. The signals V_Cbi1 and V_Cbi2 slightly raise up (kicked back up) in the time interval T4. Similarly, although the signal V_Cbi1 rises in the time interval T4 in FIG. 4, the raising occurs at the timing that the bias switches SW_bi1 changes from off to on. Therefore, the raise can be regarded as occurring at the end of the time interval T3 and the beginning of the time interval T4. The signal V_Cbi2 also follows the same rule. The operations of kicks back up are shown as the arrows illustrated in the drawing corresponding to the time interval T3.

After the time interval T5, the steps in FIG. 3 are repeated. That is, the operations in time intervals T5, T6, T7 are the same as which in time intervals T1, T2, T3, thus are omitted for brevity here.

Please refer to FIG. 2 again. Since currents flowing through the node C and the node D are large, the voltages at the node C and the mode D can be rapidly set to a desired value. On the opposite, since currents flowing through the node A and the node B are small, the voltages at the node A and the mode B need more time to be set to a desired value. In such case, as shown in the time interval T2 in FIG. 4, the signals V_Cbi1 and V_Cbi2 are pulled down (kicked back down) by the grounding voltage since the output switch SW_O change from on to off. On the opposite, as shown in the time interval T4 in FIG. 4, the signals V_Cbi1 and V_Cbi2 are pulled up (kicked back up) by the power voltage V_DD since the output switch SW_O change from off to on.

Therefore, the kick back issue caused by the turn on, turn off of the output switch SW_O can be compensated. Without such mechanism, the output current may be interfered by the kick back issue. For example, if the bias switches SW_bi1, SW_bi2 are replaced by resistors and only the output switch SW_O exists, the e signals V_Cbi1 and the V_Cbi2 are repeatedly kicked up down and up corresponding to on and off of the bias switches SW_bi1, SW_bi2. Accordingly, the output current I_O may be non-ideal since the signals V_Cbi1 and the V_Cbi2 vary due to the kick back issue.

Please note, the operations illustrated in FIG. 3 and FIG. 4 are only examples and do not mean to limit the scope of the present invention. Any variation based on the above-mentioned descriptions should fall in the scope of the present invention. Based on the operations in FIG. 3 and FIG. 4, the operations of the output stage circuit 100 in FIG. 1 can be summarized as: the bias switch circuit 105 is non-conducted in a calibration time interval (time intervals T3, T4 in FIG. 3 and FIG. 4), and the output switch circuit 103 is non-conducted and then conducted in the calibration time interval. In one embodiment, the bias switch circuit 105 is non-conducted in an output time interval (the time interval T2 in FIG. 3 and FIG. 4) before the calibration time interval, and the output switch circuit 103 is conducted in the output time interval. Also, in one embodiment, the bias switch circuit 105 is conducted in a pre-charge time interval (the time interval T1 in FIG. 3 and FIG. 4) before the output time interval. The output switch circuit 103 is conducted in the pre-charge time interval.

Figure 5:
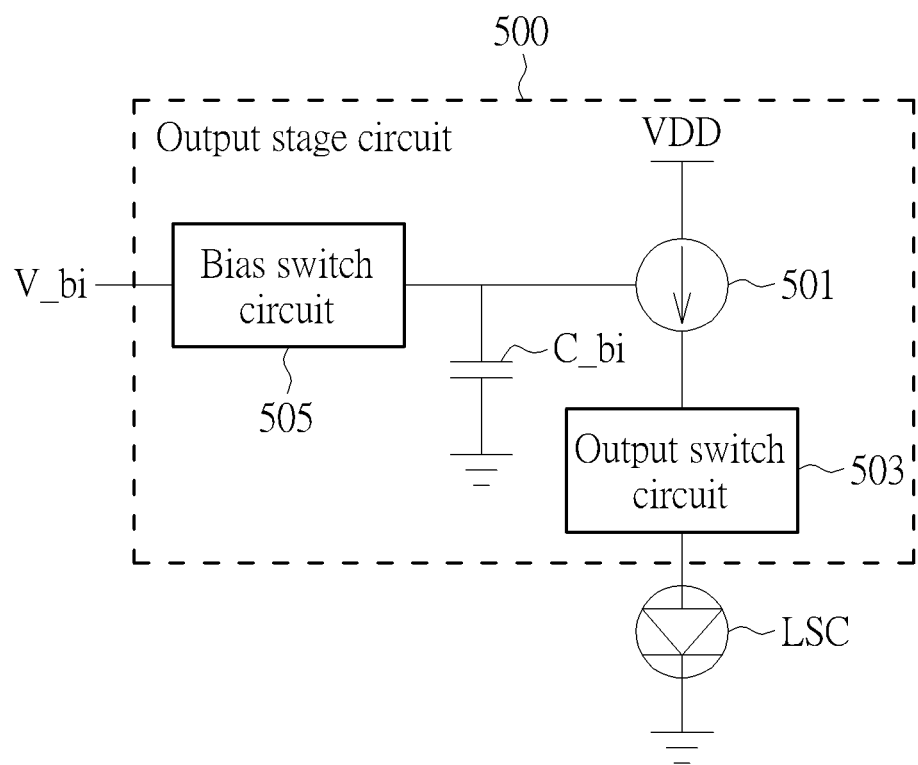
FIG. 5 is a schematic diagram illustrating an output stage circuit according to another embodiment of the present invention.

The structure of the output stage circuit is not limited to which in FIG. 1. FIG. 5 is a schematic diagram illustrating an output stage circuit according to another embodiment of the present invention. As illustrated in FIG. 5, the output stage circuit 500 comprises a current source circuit 501, an output switch circuit 503, at least one bias capacitor C_bi (in this embodiment, one bias capacitor) and a bias switch circuit 505. The bias switch circuit 505 is coupled to the bias capacitor C_bi and the light source 501. The current source circuit 501 is coupled between the power voltage V_DD and the output switch circuit 503. The light source circuit LSC is coupled between the output switch circuit 503 and the grounding voltage. One difference between the output stage circuit 100 in FIG. 1 and the output stage circuit 500 in FIG. 5 is that the output switch circuit 103 in FIG. 1 is coupled to a cathode of the light source circuit LSC, but the output switch circuit 503 in FIG. 5 is coupled to an anode of the light source circuit LSC.

Figure 6:
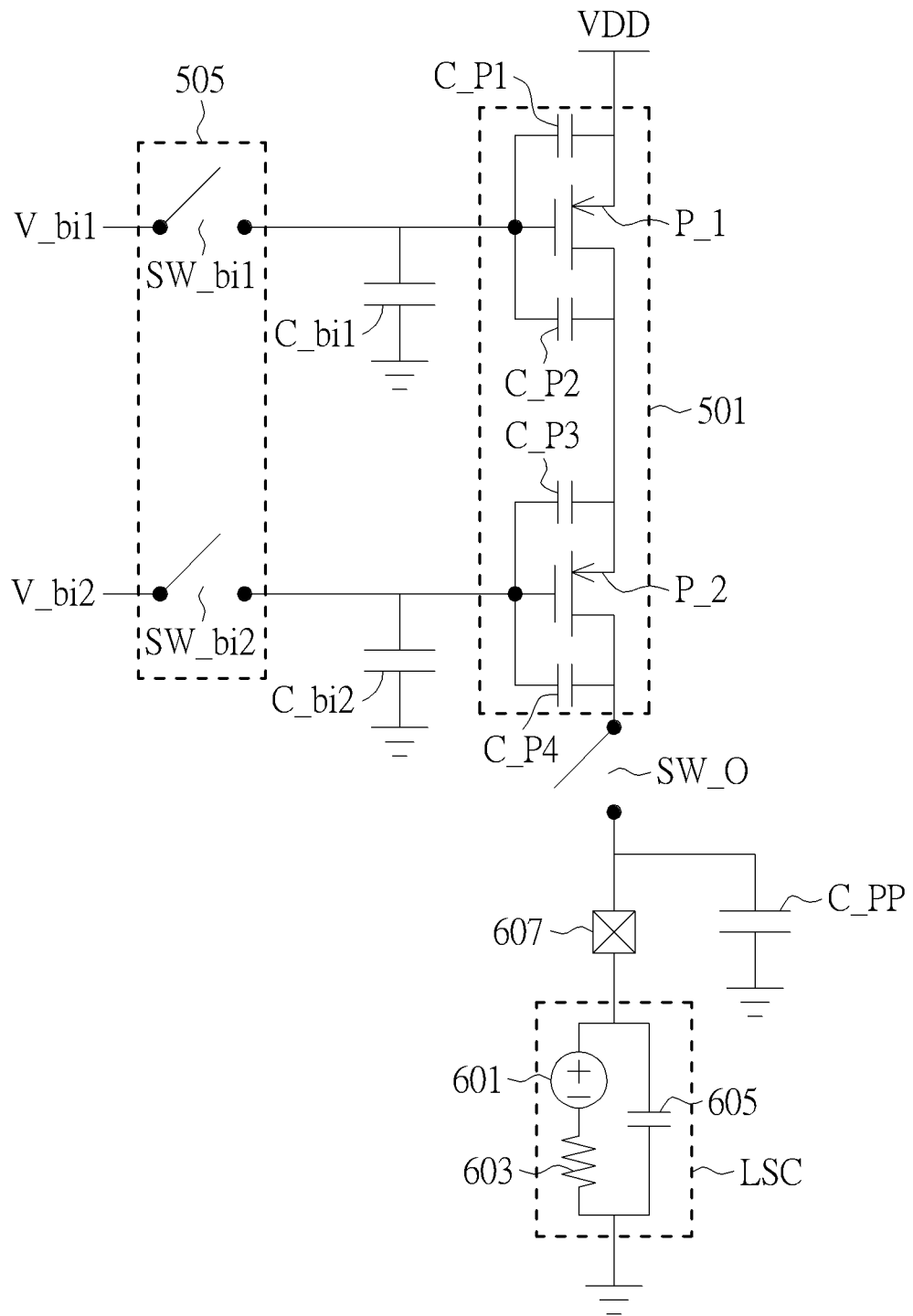
FIG. 6 is a detail circuit diagram of the output stage circuit illustrated in FIG. 5, according to one embodiment of the present invention.

FIG. 6 is a detail circuit diagram of the output stage circuit illustrated in FIG. 5, according to one embodiment of the present invention. In the embodiment of FIG. 6, the light source circuit LSC comprises a light source 601 (e.g., an LED, a laser diode), a resistor 603 and a capacitor 605. The output switch circuit 503 in FIG. 5 comprises an output switch SW_O. Also, an I/O pad 607 is provided between the light source circuit LSC and the capacitor C_PP which means pad parasitic capacitance of the I/O pad 207. The capacitor C_PP is located between the I/O pad 607 and the grounding voltage. The light source 601 is coupled between the resistor 603, which is coupled to the grounding voltage, and the I/O pad 607. The capacitor 605 is coupled between the I/O pad 607 and the grounding voltage.

The current source circuit 501 comprises a plurality of transistors coupled in series. In this example, the current source circuit 501 comprises PMOSs P_1 and P_2 coupled in series. Further, in the embodiment of FIG. 6, the output stage circuit 500 comprises two bias capacitors C_bi1, C_bi2 and the bias switch circuit 505 comprises two bias switches SW_bi1, SW_bi2. The bias capacitors C_bi1, C_bi2 and the bias switches SW_bi1, SW_bi2 are respectively coupled to a control terminal of the transistors, that is, coupled to gate terminals of the PMOSs P_1 and P_2. The bias capacitors C_bi1, C_bi2 are further coupled to the grounding voltage. The bias capacitors C_bi1, C_bi2 can be capacitors which are particularly provided, but can mean the parasitic capacitances of the PMOSs P_1 and P_2. Also, the capacitors C_P1, C_P2, C_P3 and C_P4 mean parasitic capacitances of the PMOSs P_1 and P_2.

For more detail, each of the PMOSs P_1 and P_2 comprises a first terminal (source terminal), a second terminal (drain terminal), and a gate terminal, and each of the PMOSs P_1 and P_2 further comprises: a first parasitic capacitor C_P1 (or C_P3) being formed between the gate terminal and the first terminal, and a second parasitic capacitor C_P2 (or C_P4) being formed between the gate terminal and the second terminal.

Figure 7:
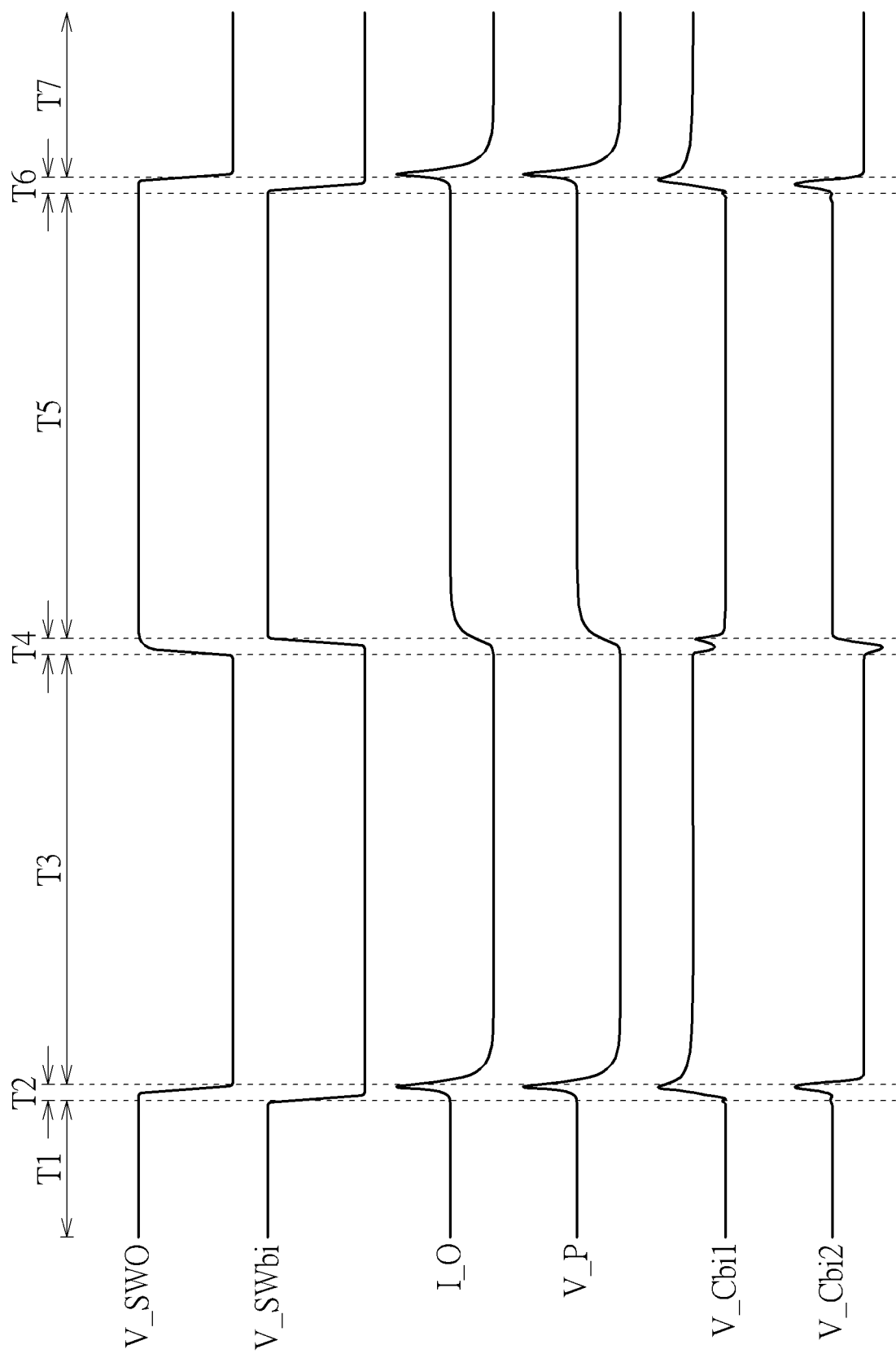
FIG. 7 is a wave chart for signals of the output stage circuit in FIG. 5, according to one embodiment of the present invention.

FIG. 7 is a wave chart for signals of the output stage circuit in FIG. 6, according to one embodiment of the present invention. The time intervals T1, T2, T3, T4, T5, T6 and T7, and the signals V_SWO, V_SWbi, 1_0 in FIG. 7 are the same as the time intervals T1, T2, T3, T4, T5, T6 and T7, and the signals V_SWO, V_SWbi, 1_0 illustrated in FIG. 4. However, the variations of the signals V_P, V_Cbi1 and V_Cbi2 in FIG. 7 are opposite to the variations of the signals V_P, V_Cbi1 and V_Cbi2 in FIG. 4. For more detail, in the time interval T2, the signals V_P, V_Cbi1 and V_Cbi2 in FIG. 7 increase but the signals V_P, V_Cbi1 and V_Cbi2 in FIG. 4 decrease. On the opposite, in the time interval T4, the signals V_P, V_Cbi1 and V_Cbi2 in FIG. 7 decrease but the signals V_P, V_Cbi1 and V_Cbi2 in FIG. 4 increase. Thus, the signals V_Cbi1 and V_Cbi2 are kicked back up in the time interval T2 and are kicked back down in the time interval T4. Therefore, the kick back issue can still be compensated.

Therefore, in FIG. 7, in the time interval T1, the signals V_SWO and V_SWbi have high logic values, which mean the output switch SW_O and the bias switches SW_bi1, SW_bi2 turn on (conducted). In the time intervals T2, T3, the V_SWbi firstly transits to a low logic value and then the signal V_SWO transits to the low logic value, which mean the bias switches SW_bi1, SW_bi2 firstly turn off and then the output switch SW_O turns off. The output current I_O suddenly increases in the time interval T2 and goes to 0 in the time interval T3. Correspondingly, the signal V_P increases in the time interval T2 and remains high in the time interval T3. The signal V_Cbi1 slightly increases in the time interval T2 and is kicked back down in the time interval T3. Also, the signal V_Cbi2 slightly increases in the time interval T2 and is kicked back up in the time interval T3.

In the time intervals T4 and T5, the signal V_SWO firstly transits to a high logic value and then the V_SWbi transits to the high logic value, which mean the output switch SW_O firstly turns on and then the bias switches SW_bi1, SW_bi2 turn on. The output current I_O raises up in the time intervals T4 and T5 (i.e., flows through the light source circuit LSC), since the output switch SW_O turns on. Oppositely, the signal V_P decreases in the time intervals T4 and T5. The signal V_Cbi1 is kicked back down in the time interval T4. Also, the signal V_Cbi2 is kicked back up in the time interval T4. After the time interval T5, the steps in FIG. 3 are repeated. That is, the operations in time intervals T5, T6, T7 are the same as which in time intervals T1, T2, T3, thus are omitted for brevity here.

As above-mentioned, the signal V_Cbi1 is kicked back down in the time interval T3 and is kicked back up in the time interval T4. Further, the signal V_Cbi2 is kicked back up in the time interval T3 and is kicked back down in the time interval T4. Therefore, the kick back issue caused by the turn on, turn off of the output switch SW_O can be compensated.

Figure 8:
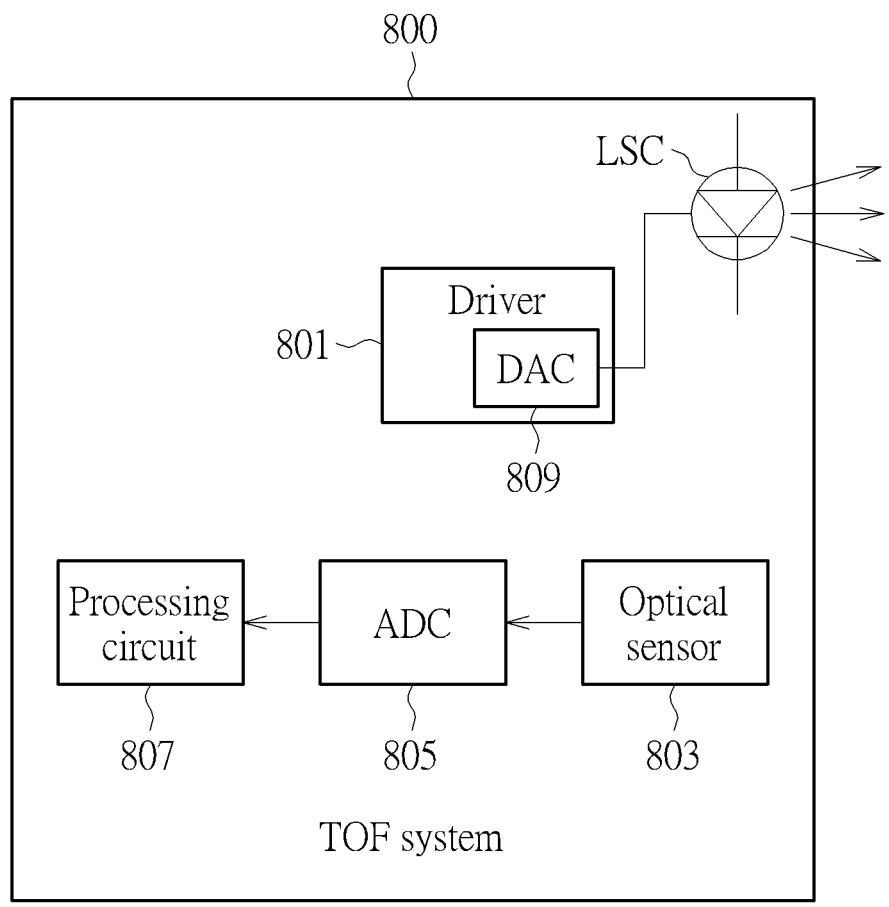
FIG. 8 is a block diagram illustrating that the output stage circuit provided by the present invention is applied to a TOF system, according to one embodiment of the present invention.

The above-mentioned output stage circuit can be provided to a DAC (digital to analog converter) to control the target circuit to generate desired signals. In one embodiment, the DAC is a single ended DAC. Also, in one embodiment, the DAC is applied to a TOF (Time Of Flight) system. FIG. 8 is a block diagram illustrating that the output stage circuit provided by the present invention is applied to a TOF system, according to one embodiment of the present invention. As illustrated in FIG. 8, the TOF system 800 comprises a light source circuit LSC, a driver 801, an optical sensor 803, an ADC 805, and a processing circuit 807. The DAC 809 is configured to drive the light source circuit LSC to generate a specific light pattern. In other words, the DSC 809 modulates a digital code to an analog light signal. After the specific light pattern is generated, the optical sensor 803 (e.g., an image sensor) is configured to sense optical data generated by reflected light of the specific light pattern. The ADC 805 is configured to transform the sensing signals generated by the optical sensor to digital data. Afterwards, the processing circuit is configured to compute a distance between the TOF system 800 and an object according to the digital data output by the ADC 805. Other details of the TOF system 800 is well known by persons skilled in the art, thus descriptions thereof are omitted for brevity here. In other words, in the embodiment of FIG. 8, the light source circuit LSC is controlled by a light emitting signal to emit light. The light emitting signal is the signal V_SWO illustrated in FIG. 4 and FIG. 7.

Figure 9:
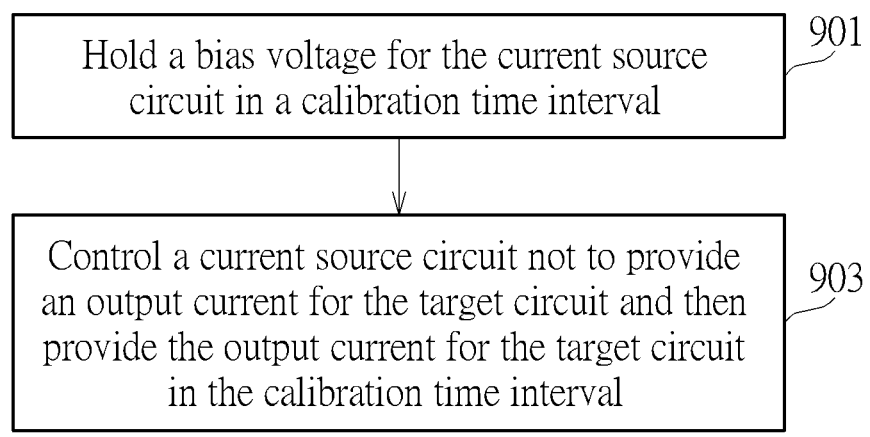
FIG. 9 is a flow chart illustrating a current driving method according to one embodiment of the present invention.

In view of above-mentioned embodiments, a current driving method can be acquired. The current driving method corresponds FIG. 3 and FIG. 4 and comprises the following steps shown in FIG. 9.

Step 901

Hold a bias voltage for the current source circuit in a calibration time interval.

For example, in the time intervals T3, T4 in FIG. 3, the bias switches SW_bi1, SW_bi2 turn off such that bias voltage are hold by the bias capacitors C_bi1, C_bi2.

Step 903

Control a current source circuit not to provide an output current for the target circuit and then provide the output current for the target circuit in the calibration time interval.

For example, in the time interval T3, the output switch SW_O turns off such that no output current I_O flows through the light source circuit LSC. In the time interval T4, the output switch SW_O turns on such that the output current I_O flows through the light source circuit LSC.

In one embodiment, the current driving method further comprises: hold the bias voltage for the current source circuit in an output time interval before the calibration time interval. Controlling the current source circuit to provide the output current for the target circuit in the output time interval). For example, in the time interval T2 in FIG. 3, the bias switches SW_bi1, SW_bi2 turn off such that bias voltage are hold by the bias capacitors C_bi1, C_bi2. Also, in the time interval T2, the output switch SW_O turns on such that the output current I_O flows through the light source circuit LSC.

In one embodiment, the current driving method further comprises: pre-charging at least bias capacitor to generate the bias voltage in a pre-charge time interval before the output time interval; controlling the current source circuit to provide the output current for the target circuit in the pre-charge time interval. For example, in the time interval T1 in FIG. 3, the bias switches SW_bi1, SW_bi2 turn on such that bias voltages V_bi1, V_bi2 charge the bias capacitors C_bi1, C_bi2 to generate bias voltages. Also, in the time interval T1, the output switch SW_O turns on such that the output current I_O flows through the light source circuit LSC.

In view of above-mentioned embodiment, the interference of the current flowing through the target circuit which occurs when the output stage circuit is coupled to a power voltage or dis-coupled from the power voltage can be compensated. Therefore, the conventional kick back issue can be improved. Besides, the output stage circuit only needs a low standby current and can control a current size of the output current by setting parameters of transistors in the current source. An output stage or a DAC applying such mechanism can generate a square wave with a high frequency (MHz-GHz), thus can be applied to a high speed TO F.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An output stage circuit, comprising:
   a current source circuit;
   an output switch circuit, comprising at least one output switch, coupled to the current source circuit, wherein an output current flows through a target circuit when the output switch circuit is conducted;
at least one bias capacitor, coupled to the current source circuit; and
a bias switch circuit, configured to receive a bias voltage, comprising at least one bias switch, coupled to the bias capacitor and the current source circuit, wherein the bias voltage charges the bias capacitor when the bias switch circuit is conducted.

2. The output stage circuit of claim 1, wherein the bias switch circuit is non-conducted in a calibration time interval, wherein the output switch circuit is non-conducted and then conducted in the calibration time interval.

3. The output stage circuit of claim 2, wherein the bias switch circuit is non-conducted in an output time interval before the calibration time interval, wherein the output switch circuit is conducted in the output time interval.

4. The output stage circuit of claim 3, wherein the bias switch circuit is conducted in a pre-charge time interval before the output time interval, wherein the output switch circuit is conducted in the pre-charge time interval.

5. The output stage circuit of claim 1, wherein the current source circuit comprises a plurality of transistors coupled in series, wherein the output stage circuit comprises a plurality of bias capacitors and the bias switch circuit comprises a plurality of the bias switches, wherein the bias capacitors and the bias switches are respectively coupled to a control terminal of the transistors.

6. The output stage circuit of claim 5, wherein the transistors are PMOSs or NMOSs, each of the transistors having a first terminal, a second terminal, and a gate terminal, and each of the transistor further comprising: a first parasitic capacitor being formed between the gate terminal and the first terminal, a second parasitic capacitor being formed between the gate terminal and the second terminal.

7. A digital to analog converter, comprising:
a current source circuit;
an output switch circuit, comprising at least one output switch, coupled to the current source circuit, wherein an output current flows through a target circuit when the output switch circuit is conducted;
at least one bias capacitor, coupled to the current source circuit; and
a bias switch circuit, configured to receive a bias voltage, comprising at least one bias switch, coupled to the bias capacitor and the current source circuit, wherein the bias voltage charges the bias capacitor when the bias switch circuit is conducted.

8. The digital to analog converter of claim 7, wherein the bias switch circuit is non-conducted in a calibration time interval, wherein the output switch circuit is non-conducted and then conducted in the calibration time interval.

9. The digital to analog converter of claim 8, wherein the bias switch circuit is non-conducted in an output time interval before the calibration time interval, wherein the output switch circuit is conducted in the output time interval.

10. The digital to analog converter of claim 9, wherein the bias switch circuit is conducted in a pre-charge time interval before the output time interval, wherein the output switch circuit is conducted in the pre-charge time interval.

11. The digital to analog converter of claim 7, wherein the current source circuit comprises a plurality of transistors coupled in series, wherein the digital to analog converter comprises a plurality of bias capacitors and the bias switch circuit comprises a plurality of the bias switches, wherein the bias capacitors and the bias switches are respectively coupled to a control terminal of the transistors.

12. The digital to analog converter of claim 11, wherein the transistors are PMOSs or NMOSs, each of the transistors having a first terminal, a second terminal, and a gate terminal, and each of the transistor further comprising: a first parasitic capacitor being formed between the gate terminal and the first terminal, a second parasitic capacitor being formed between the gate terminal and the second terminal.

13. A time of flight system, comprising:
a light source circuit, controlled by a light emitting signal to emit light;
a current source circuit;
an output switch circuit, comprising at least one output switch, coupled to the current source circuit and controlled by the light emitting signal to be conducted or non-conducted, wherein an output current flows through the light source circuit when the output switch circuit is conducted;
at least one bias capacitor, coupled to the current source circuit; and
a bias switch circuit, configured to receive a bias voltage, comprising at least one bias switch, coupled to the bias capacitor and the current source circuit, wherein the bias voltage charges the bias capacitor when the bias switch circuit is conducted.

14. The time of flight system of claim 13, wherein the bias switch circuit is non-conducted in a calibration time interval, wherein the output switch circuit is non-conducted and then conducted in the calibration time interval.

15. The time of flight system of claim 14, wherein the bias switch circuit is non-conducted in an output time interval before the calibration time interval, wherein the output switch circuit is conducted in the output time interval.

16. The time of flight system of claim 15, wherein the bias switch circuit is conducted in a pre-charge time interval before the output time interval, wherein the output switch circuit is conducted in the pre-charge time interval.

17. The time of flight system of claim 13, wherein the current source circuit comprises a plurality of transistors coupled in series, wherein the time of flight system comprises a plurality of bias capacitors and the bias switch circuit comprises a plurality of the bias switches, wherein the bias capacitors and the bias switches are respectively coupled to a control terminal of the transistors.

18. The time of flight system of claim 17, wherein the transistors are PMOSs or NMOSs, each of the transistors having a first terminal, a second terminal, and a gate terminal, and each of the transistor further comprising: a first parasitic capacitor being formed between the gate terminal and the first terminal, a second parasitic capacitor being formed between the gate terminal and the second terminal.

19. A current driving method, applied to the output stage circuit as claim 1, comprising:
holding a bias voltage in the at least one bias capacitor for the current source circuit in a calibration time interval; and
controlling the current source circuit not to provide an output current for the target circuit and then provide the output current for the target circuit in the calibration time interval.

20. The current driving method of claim 19, further comprising:
holding the bias voltage for the current source circuit in an output time interval before the calibration time interval; and
controlling the current source circuit to provide the output current for the target circuit in the output time interval.

21. The current driving method of claim 20, further comprising:
   pre-charging at least bias capacitor to generate the bias voltage in a pre-charge time interval before the output time interval;
   controlling the current source circuit to provide the output current for the target circuit in the pre-charge time interval.

* * * * *